US012604678B2

(12) United States Patent
Chang et al.

(10) Patent No.: US 12,604,678 B2
(45) Date of Patent: Apr. 14, 2026

(54) VERTICAL PHASE CHANGE SWITCH UTILIZING A THERMALLY CONDUCTIVE SIDEWALL DIELECTRIC FOR HIGH-EFFICIENCY HEATING

(71) Applicant: Taiwan Semiconductor Manufacturing Company, Ltd., Hsinchu (TW)

(72) Inventors: Kuo-Pin Chang, Hsinchu (TW); Yu-Wei Ting, Taipei (TW); Tsung-Hao Yeh, Hsinchu (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 770 days.

(21) Appl. No.: 17/851,036

(22) Filed: Jun. 28, 2022

(65) Prior Publication Data

US 2023/0422644 A1     Dec. 28, 2023

(51) Int. Cl.
*H10N 70/00* (2023.01)
*H10N 70/20* (2023.01)

(52) U.S. Cl.
CPC ....... *H10N 70/8616* (2023.02); *H10N 70/061* (2023.02); *H10N 70/231* (2023.02); *H10N 70/823* (2023.02); *H10N 70/8413* (2023.02); *H10N 70/8828* (2023.02)

(58) Field of Classification Search
None
See application file for complete search history.

(56) References Cited

U.S. PATENT DOCUMENTS

| | | | |
|---|---|---|---|
| 2007/0194294 A1* | 8/2007 | Song | H10N 70/8413 257/E29.17 |
| 2011/0223739 A1 | 9/2011 | Tu | |
| 2016/0035977 A1 | 2/2016 | Liu | |
| 2016/0064656 A1 | 3/2016 | Lin et al. | |

FOREIGN PATENT DOCUMENTS

TW       201926577 A       7/2019

OTHER PUBLICATIONS

First office action received in the counterpart Taiwan application 112114962, mailed on Dec. 21, 2023.

* cited by examiner

*Primary Examiner* — Hung K Vu
(74) *Attorney, Agent, or Firm* — KILPATRICK TOWNSEND & STOCKTON LLP

(57) ABSTRACT

A phase change device includes a substrate with a top surface. A heater structure is disposed on the substrate. The heater structure has first and second sidewalls on opposite sides of the heater structure. A phase change element is disposed over the heater structure. The phase change element includes three connected portions. A first portion is disposed over the heater structure. A second portion is disposed over the first sidewall of the heater structure. A third portion is over a first portion of the top surface of the substrate adjacent to and spaced apart from the first sidewall of the heater structure.

19 Claims, 12 Drawing Sheets

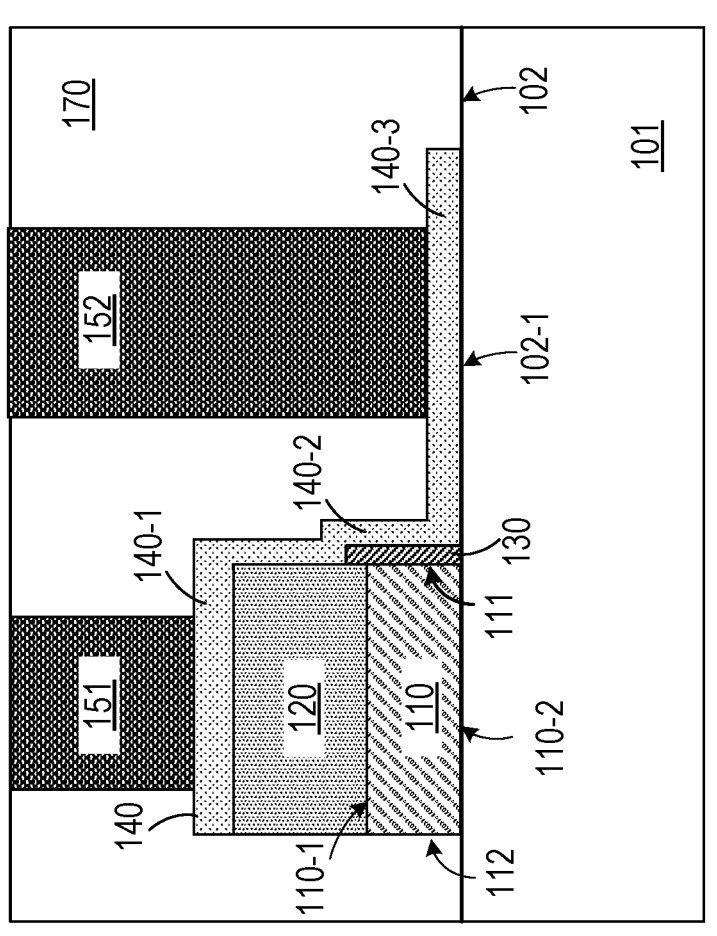
FIG. 1A

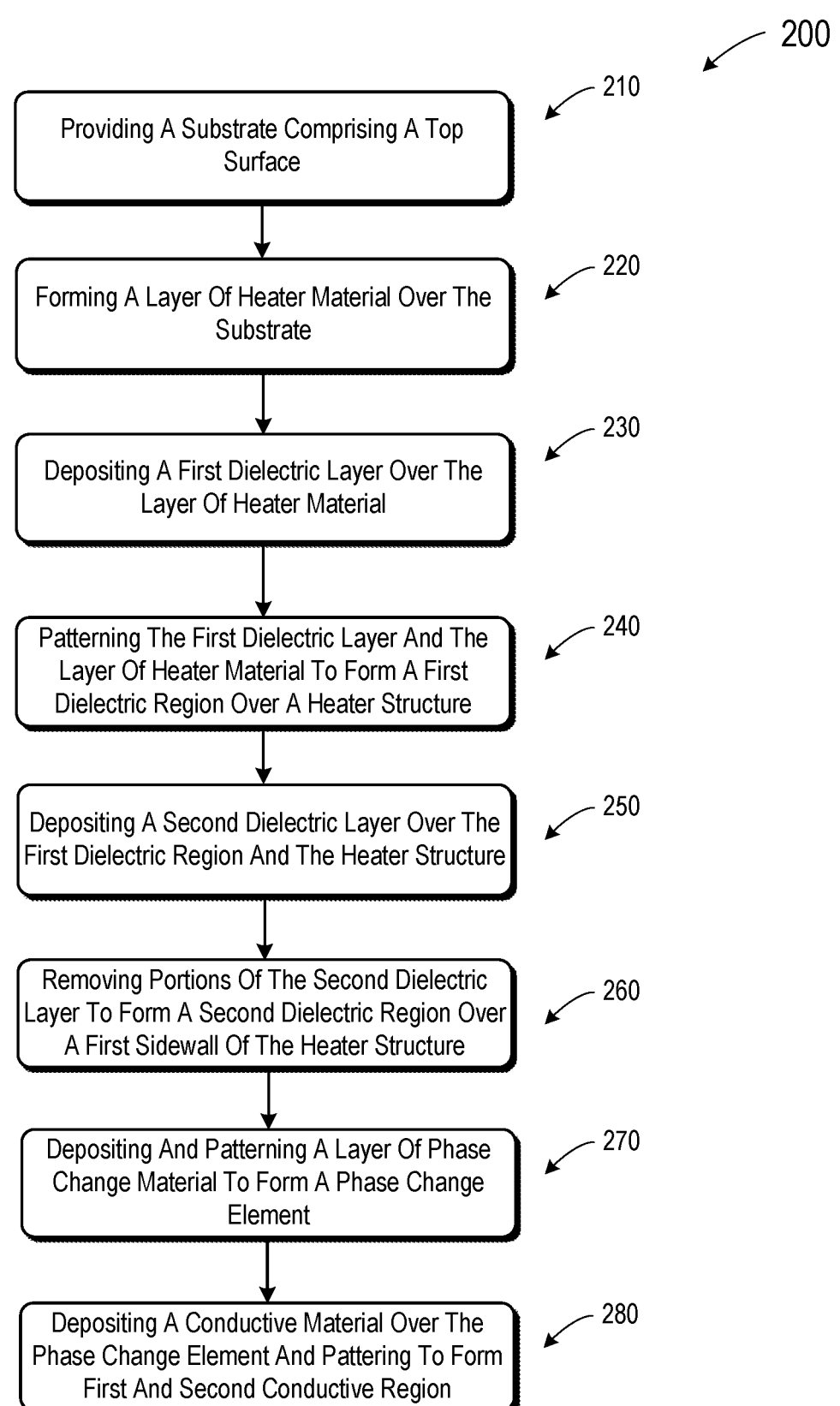

200

Providing A Substrate Comprising A Top Surface          210

Forming A Layer Of Heater Material Over The Substrate          220

Depositing A First Dielectric Layer Over The Layer Of Heater Material          230

Patterning The First Dielectric Layer And The Layer Of Heater Material To Form A First Dielectric Region Over A Heater Structure          240

Depositing A Second Dielectric Layer Over The First Dielectric Region And The Heater Structure          250

Removing Portions Of The Second Dielectric Layer To Form A Second Dielectric Region Over A First Sidewall Of The Heater Structure          260

Depositing And Patterning A Layer Of Phase Change Material To Form A Phase Change Element          270

Depositing A Conductive Material Over The Phase Change Element And Patterning To Form First And Second Conductive Region          280

FIG. 2

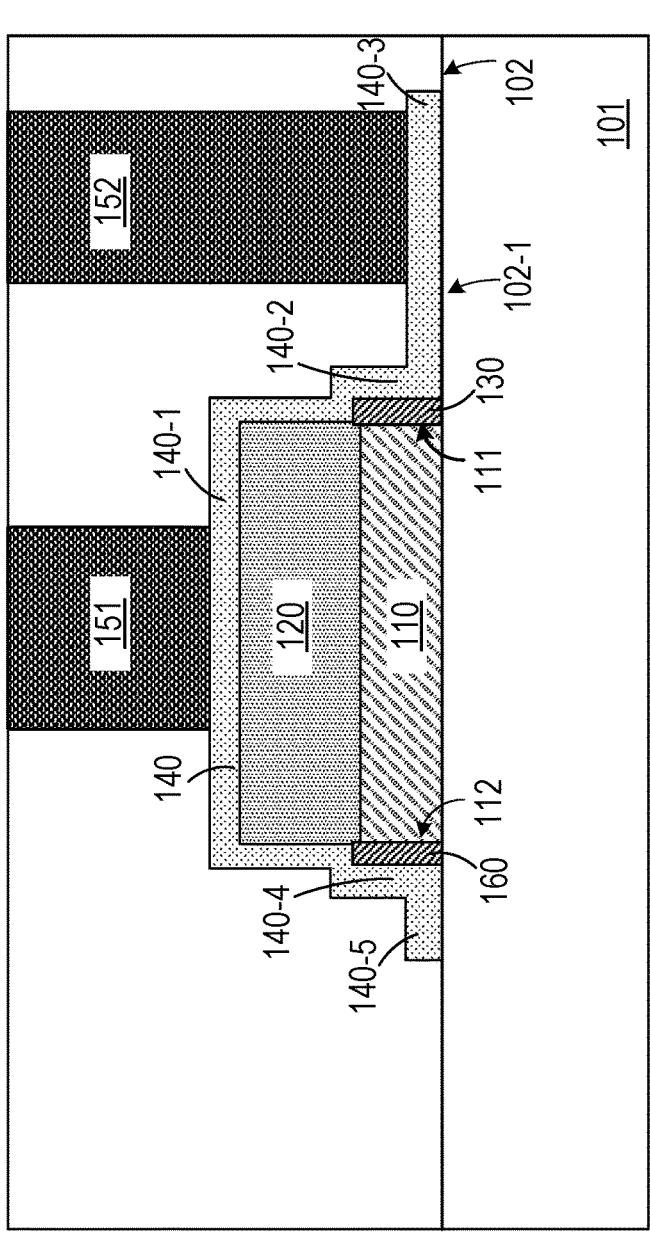
FIG. 6

VERTICAL PHASE CHANGE SWITCH UTILIZING A THERMALLY CONDUCTIVE SIDEWALL DIELECTRIC FOR HIGH-EFFICIENCY HEATING

BACKGROUND

Modern electronics applications require switching devices capable of accommodating very high frequency signals, for example, in frequency bands of 27 GHz (gigahertz) or greater for fifth generation (5G) wireless applications. The requirements of device parameters are difficult to meet in current semiconductor switching technologies, such as CMOS technology. With a fast switching time, phase change switches are one of the promising alternative technologies for high frequency applications. A phase change switch utilizes a phase change material to control a conductive connection between two terminals. The switching operation is performed by transitioning between high resistance and low resistance states, e.g., through the application of heat to the phase change material.

While promising, phase change switches still face challenges in device parameter requirements such as Ron (on-resistance), Coff (off-capacitance), and power consumption, etc. Therefore, further improvement is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a cross-sectional view diagram illustrating a phase change device, in accordance with some embodiments.

FIG. 2 is a flowchart illustrating a method for forming a phase change device, in accordance with some embodiments.

FIG. 6 is a cross-sectional view diagram illustrating yet another phase change device, in accordance with some embodiments.

DETAILED DESCRIPTION

Figure 1B:
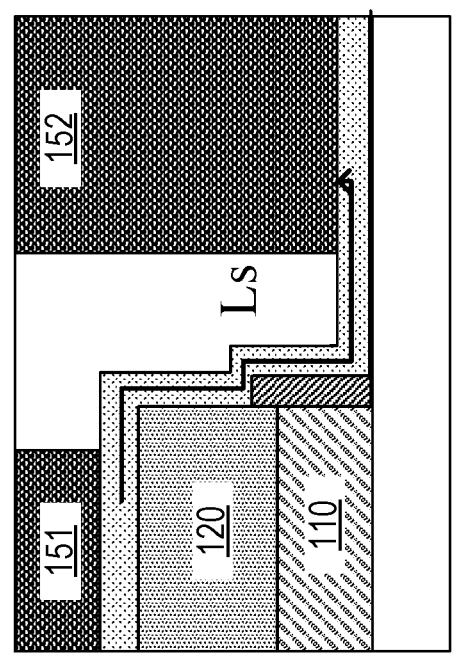
FIGS. 1B-1E are cross-sectional view diagrams illustrating properties of the phase change device of FIG. 1A, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of this disclosure are related to devices and methods for low write voltage and high FOM (Figures of Merit) and low write voltage phase change material (PCM) switch devices. These devices can be used in high-frequency radio frequency (RF) applications. To achieve high FOM, it is desirable for the switch device to have low insertion loss (related to Ron) and high isolation (related to Coff). In some embodiments, the FOM is related Ron and Coff, $\sim 1/(2\pi \text{RonCoff})$. The write power for the phase change element is determined by the resistance of the heater material R, $P=V^2/R$.

In contrast, typical conventional phase change switch structures, in which the phase change material is disposed on the heater structure with the horizontal channel arrangement, suffer from tradeoffs between the FOM and the write voltage. One reason is that the heater width simultaneously affects FOM and write voltage in opposite directions. A large heater width is favorable for a low write voltage owing to the low-R heater, but it inversely decreases the FOM because of the high Ron. Besides, in the conventional phase change devices, the RF pads overlap the heater structure, causing thermal loss through the RF pads, resulting in low heating efficiency. Further, in the conventional phase change switch devices, a short channel length Ls reduces resistance Ron. However, the short channel length also means narrower heater width and high heater resistance, which leads to a high write voltage.

FIG. 1A is a cross-sectional view diagram illustrating a phase change device, in accordance with some embodiments. As shown in FIG. 1A, a phase change device 100 includes a substrate 101 having a top surface 102, and a heater structure 110 disposed on the substrate 101. The heater structure 110 has a first sidewall 111 and second sidewall 112 on opposite sides of the heater structure 110. Phase change device 100 also includes a first dielectric region 120 disposed over the heater structure 110. The first dielectric region 120 includes a thermally insulating and electrically insulating material. Phase change device 100 also includes a second dielectric region 130 disposed over the first sidewall 111 of the heater structure 110. The second dielectric region 130 includes a thermally conductive and electrically insulating material. A phase change element 140 is disposed over the first dielectric region 110, the heater structure 120, the second dielectric region 130, and a first portion 102-1 of the top surface 102 of the substrate 101 extending away from the second dielectric region 130 and the heater structure 110. Phase change device 100 also includes a first conductive region 151 and a second conductive region 152 disposed over the phase change element 140 on either side of the second dielectric region 130.

In some embodiments, the phase change element 140 includes three connected portions. A first portion 140-1 is disposed over the heater structure 110 and separated from the heater structure 110 by the first dielectric region 120. A second portion 140-2 is disposed over a sidewall 111 of the heater structure 110. A third portion 140-3 is disposed over the first portion 102-1 of the top surface 102 adjacent to and spaced apart from the first sidewall 111 of the heater structure 110. The second portion 140-2 is configured to receive heat from heater structure 110 through the second dielectric region 130, which changes the resistivity of the second portion 140-2. The first portion 140-1 and the third portion 140-3 are configured to be contacted by conductive regions that are electrodes of the phase change switch device.

In FIG. 1A, the heater structure 110 is connected to two heater pads (not shown). A voltage is applied between the heater pads to generate heat in the heater structure 110. The heat is transmitted to the phase change element 140 through the second dielectric region 130. The phase change element 140 switches between crystalline and amorphous states, which are a low resistance state and a high resistance state, respectively. The active area in the phase change element 140 of heater structure 110 is the overlapped region between the phase change element 140 and the heater structure 110 through the thermally conductive second dielectric region 130. To read resistance state of the phase change element 140, a voltage is applied to the first conductive region 151 and the second conductive region 152, which are also referred to as RF pads.

The phase change element may be transitioned to the amorphous state by applying short pulses (e.g., pulses in the range of 50-500 nanoseconds) of high intensity heat which causes the phase change material to reach a melting temperature, e.g., in the range of 600° C. to 750° C., and up to 1000° C., followed by a rapid cooling of the material. The phase change material may be transitioned to the crystalline state by applying longer duration pulses (e.g., pulses in the range of 0.5-10 microseconds) of lower intensity heat, which causes the phase change material to reach a temperature at which the material quickly crystallizes and is highly conductive, e.g., in the range of 250° C. to 350° C., and up to 500° C.

In some embodiments, the first dielectric region 120 includes a silicon oxide material, and the second conductive region 152 includes a silicon nitride material.

In some embodiments, the phase change element comprises a phase change material, and the phase change material comprises a germanium (Ge)-antimony (Sb)-tellurium (Te) (GST) material or an indium (In)-antimony (Sb)-tellurium (Te) (IST) material.

In some embodiments, the second dielectric region 130 is configured as a sidewall spacer to the heater structure 110 and disposed perpendicularly to the top surface 102 of the substrate 101.

In some embodiments, the phase change element 140 includes a portion 140-2 that extends perpendicularly to the top surface 102 of the substrate 101 and is disposed adjacent to the second dielectric region 130 to receive heat from the heating structure 110.

In some embodiments, the heater structure 110 is thermally insulated at a top surface 110-1 and a bottom surface 110-2 by thermally insulating dielectrics and is configured to transfer heat from the first sidewall 111 through the thermally conductive second dielectric region 130 to the phase change element 140. In some embodiments, phase change element 140 also includes a dielectric layer 170, for example, an inter-layer dielectric, deposited over the device structure and planarized to form the phase change device 100 illustrated in FIG. 1A.

FIGS. 1B-1E are cross-sectional view diagrams illustrating properties of the phase change device of FIG. 1A, in accordance with some embodiments.

FIG. 1B shows that the thermal conduction is confined to a region near the heater sidewall and the second portion 140-2 of the phase change element 140 through the thermally conductive and electrically isolating second dielectric region 130. The heater structure 110 is surrounded by thermally insulating dielectrics, such as silicon oxide, and heat transfer can only take place through the window defined by the second dielectric region 120, which is made of a thermally conducting dielectric, such as silicon nitride. This configuration provides for high heating efficiency.

Figure 1C:
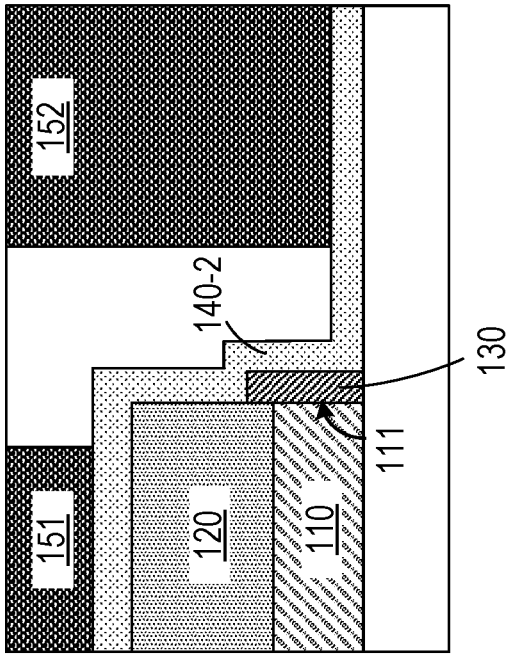
Figure 1E:
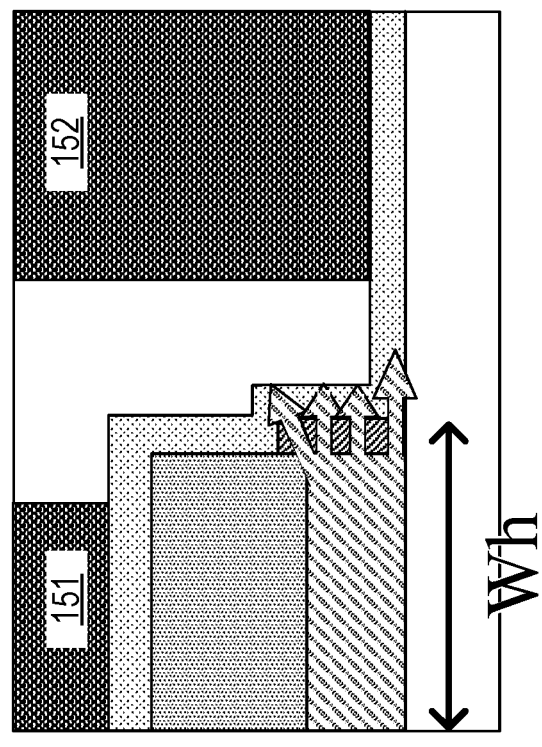

FIG. 1C shows the direction of current flow between the first and second conductive regions 151 and 152. In this embodiment, the two conductive regions 151 and 152, also referred to as RF pads, have different height above the substrate. Most of the current path is made up with crystalline phase change regions, where the resistance is low. The effective channel length, Ls, is the length of the region of the phase change element in which the resistivity is changed through heating, and is determined by the thickness of the heater element. Therefore, the effective channel length, Ls, can be made relatively short. For example, in some embodiments, the Ls can be in the range of 1 µm to 3 µm. In other embodiments, the Ls can be 0.5 µm or less. The current flows in a vertical direction through the channel region defined by the portion of phase change element adjacent to the second dielectric region 130. As a result, the resistance Ron is largely provided by a small segment of the phase change element. As a result, Ron is low. The Ron can be further reduced by decreasing the thickness of the first dielectric layer 120 as well as decreasing the thickness of the heater structure 110. For example, in some embodiments, Ron can be in a range of 1-50 ohms.

Figure 1D:
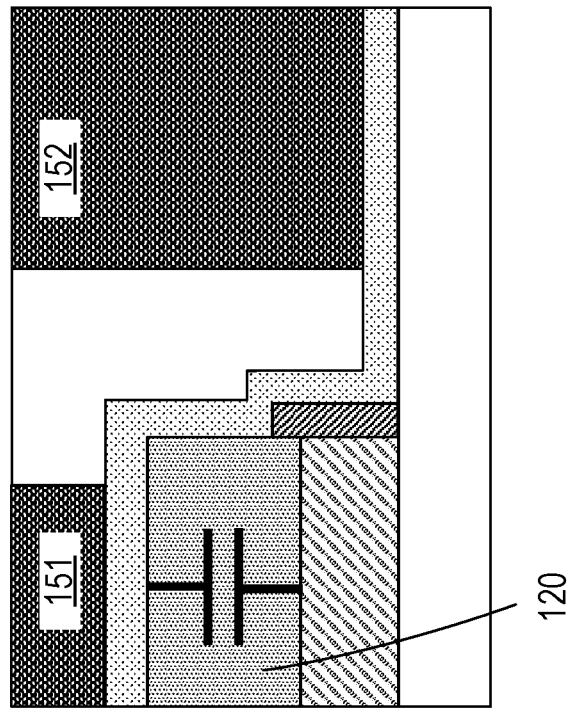

FIG. 1D shows that the cut off capacitance Coff is controllable by varying the thickness of the first dielectric region 120, substantially independent of Ron. For example, in some embodiments, Coff can be in a range of 1-100 fF.

FIG. 1E again highlights that the thermal conduction is confined to a region near the heater sidewall and the second portion 140-2 of the phase change element 140 through the thermally conductive and electrically isolating second dielectric region 130. It shows that Coff is controllable by the thickness of the first dielectric region 120, which can be a silicon oxide region. Further, a wide heater width Wh reduces write voltage owing to lower resistance of the heater structure 110. Therefore, the write voltage can be controlled separately from other device parameters, such as Ron and Coff, etc.

FIG. 2 is a flowchart illustrating a method for forming a phase change device, in accordance with some embodiments. As shown in FIG. 2, a method 200 for making a phase change device can be summarized as follows and described further with reference to FIGS. 3A-3I.

At 210—providing a substrate comprising a top surface;

At 220—forming a layer of heater material over the substrate;

At 230—depositing a first dielectric layer over the layer of heater material;

At 240—patterning the first dielectric layer and the layer of heater material to form a first dielectric region over a heater structure; and At 250—depositing a second dielectric layer over the first dielectric region and the heater structure;

AT 260—removing portions of the second dielectric layer to form a second dielectric region over a first sidewall of the heater structure;

At 270—depositing and patterning a layer of phase change material to form a phase change element over the first dielectric region, the second dielectric region, and a first portion of the top surface of the substrate extending away from the second dielectric region and the heater structure; and At 280—depositing a conductive material over the phase change element 140 and patterning the conductive material to form a first conductive region and a second conductive region on opposite sides of the second dielectric region 130.

FIGS. 3A-3I are cross-sectional view diagrams illustrating a method for forming a phase change device, in accordance with some embodiments. Method 200 outlined in the flowchart in FIG. 2 for forming phase change device 100 in FIG. 1A is described below with reference to FIGS. 3A-3I.

Figure 3A:
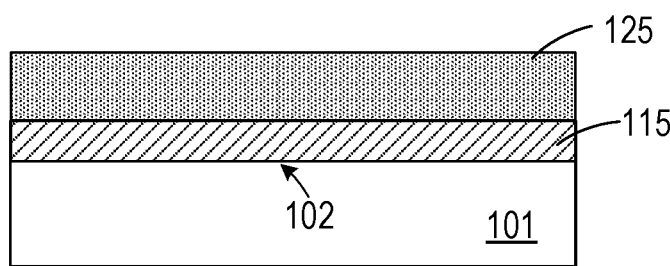
FIGS. 3A-3I are cross-sectional view diagrams illustrating a method for forming a phase change device, in accordance with some embodiments.

At 210, method 200 includes providing a substrate 101 comprising a top surface 102, as shown in FIG. 3A. In some embodiments, the phase change device 100 is used as a PCM switch. In a PCM switch structure, a substrate is used to provide mechanical support for materials forming a PCM switch. In this case, the substrate 101 can be formed of mechanically supportive, insulating, semiconducting and/or conducting materials, such as, but not limited to, Silicon Carbide (SiC), Silicon (Si), and/or Gallium Arsenide (GaAs), Alumina (Al2O3), Quartz (SiO2), Germanium (Ge), Gallium Nitride (GaN), Indium Phosphide (InP), Silicon-on-Insulator (SOI), Silicon-on-Sapphire (SOS), and/or Silicon Germanium (SiGe).

Alternatively, in some embodiments, the PCM switch could also be added directly to another device wafer (e. g., CMOS, SiGe BiCMOS, RF-CMOS) with preexisting circuits such as MMICs, ASICs or RFICs. In this case, the substrate 101 may be any suitable substrate, such as a semiconductor device substrate, and may include control elements formed during FEOL (front-end-of-the-line) processes. In some embodiments, substrate 101 may include one or more additional dielectric layers, such as ILD (interlayer dielectric) layers. In the embodiment of FIG. 1A, a heater structure 110 is formed on the substrate 101, as described further below. Therefore, the top layer (not shown) of substrate 101 is an insulating layer, both electrically insulating and thermally insulating, to shield the heater structure from other device components. For example, the top layer can be a layer of silicon oxide. Substrate 101 can include other device structures under the top insulating layer. In this case, the top layer can be part of an interlayer dielectric (ILD) separating the heater structure from the device structures below the top layer.

At 220, method 200 includes forming a layer of heater material 115 over the substrate 101, as shown in FIG. 3A. The heater is configured to generate heat in proportion to a current applied across the heater. The heater material can include, for example, a metal or metal alloy material that exhibits resistivity and a substantially high thermal conductivity. For example, in some embodiments, the heater material can include materials with low electrical resistivity and high melting point, such as tungsten (W), tungsten nitride (WN), titanium nitride (TiN), and nickel silicide (NiSi), and so on. In some embodiments, the heater material can include niobium (Nb), tungsten (W), platinum (Pt), nickel chromium (NiCr), titanium tungsten (TiW), titanium carbide (TiC), or any of a variety of similar metal or metal alloys.

In some embodiments, the thickness of heater material 115 is in a range of 300 Å to 2000 Å. The heater material can be formed using appropriate deposition processes, such as CVD (chemical vapor deposition), PVD (physical vapor deposition), and so on.

At 230, a first dielectric layer 125 is formed over the layer of heater material 115, as shown in FIG. 3A. In the embodiments, the first dielectric layer 125 includes a thermally insulating and electrically insulating material. The thermally insulating material can include any thermal insulator that can be formed through typical semiconductor processing techniques such as CVD (chemical vapor deposition), PVD (physical vapor deposition), and so on. Examples of these thermally insulating materials include oxides, e.g., silicon dioxide (SiO2), etc. The first dielectric layer 125 may include multiple layers of the same or different material.

Figure 3B:
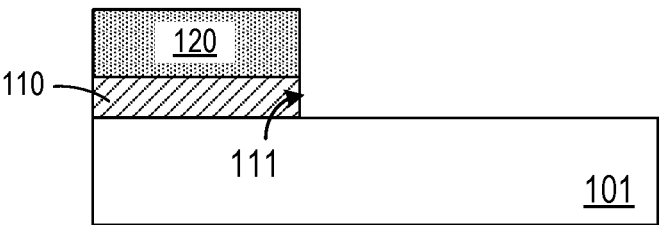

At 240, the first dielectric layer 125 and the layer of heater material 115 are patterned to form a first dielectric region 120 over a heater structure 110, as shown in FIG. 3B.

Figure 3C:
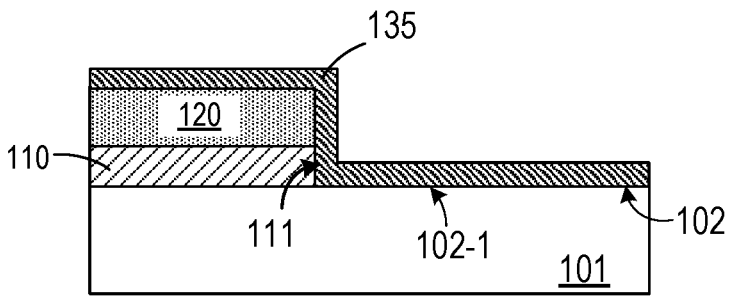

In FIG. 3C, method 200 includes, at 250, depositing a second dielectric layer 135 over the first dielectric region 120 and the heater structure 110. The second dielectric layer 135 also is disposed over a first portion 102-1 of the top surface 102 of the substrate 101 extending away from the heater structure 110. The second dielectric region includes a thermally conductive and electrically insulating material. As described below, the second dielectric layer 135 provides material for forming a spacer between the heater structure 110 and the phase change material to facilitate heating the phase change material. In some embodiments, the second dielectric layer 135 includes materials with high thermal conductivity and good electrical isolation such as silicon carbide (SiC), and aluminum nitride (AlN), and so on. The thermally conductive material can include any thermal insulator that can be formed through typical semiconductor processing techniques such as CVD (chemical vapor deposition), PVD (physical vapor deposition), and so on. In some embodiments, the thickness of second dielectric layer 135 is in a range of 300 Å to 2000 Å.

Figure 3D:
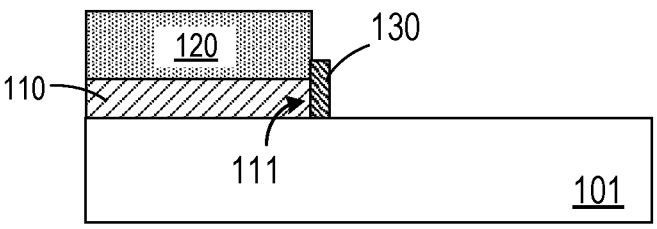

In FIG. 3D, method 200 includes, at 260, removing portions of the second dielectric layer 135 to form a second dielectric region 130 over a first sidewall 111 of the heater structure 110. The process for forming the second dielectric region 130 is similar to the spacer formation process in MOS transistor fabrication. An anisotropic etching process is used to remove the portions of the second dielectric layer 135 over the first dielectric region 120 and the first portion 102-1 of the top surface 102 of the substrate 101 extending away from the heater structure 110. As shown in FIG. 3D, a second dielectric region 130 is formed on the first sidewall 111 of heater structure 110. In some embodiments, the second dielectric region 130 is in the form of a spacer. In some embodiments, the thickness of the second dielectric region 130 is in a range of from 100 Å to 800 Å. However, depending on the embodiments, the thickness may vary.

Figure 3E:
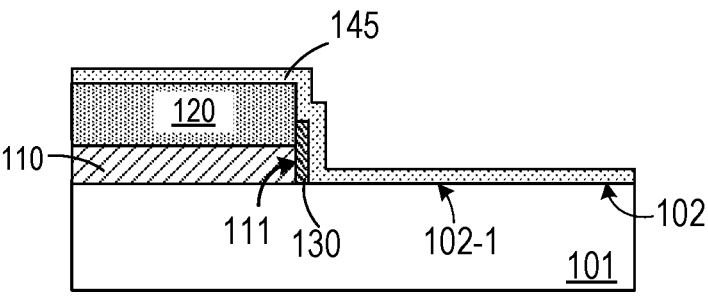
Figure 3F:
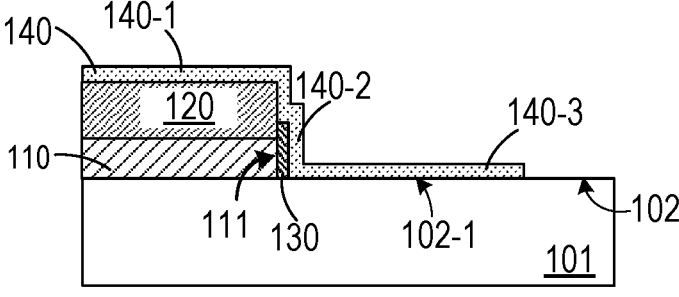

As shown in FIGS. 3E and 3F, method 200, at 270, includes depositing and patterning a layer of phase change material 145 to form a phase change element 140 over the first dielectric region 120, the second dielectric region 130, and a first portion 102-1 of the top surface 102 of the substrate 101, extending away from the second dielectric region 130 and the heater structure 110.

As shown in FIG. 3F, phase change element 140 includes three connected portions. A first portion 140-1 of the phase change element 140 is disposed over the first dielectric region 120 over the heater structure 110. A second portion 140-2 is disposed over the second dielectric region 130 over a sidewall 111 of the heater structure 110. A third portion 140-3 of the phase change element 140 is disposed over the first portion 102-1 of the top surface 102 of the substrate 101. The second portion 140-2 is configured to receive heat from heater structure 110 through the second dielectric region 130, which changes the resistivity of the second portion 140-2. The first portion 140-1 and the third portion 140-3 are configured to be contacted by conductive regions that are electrodes of the phase change switch device.

In some embodiments, the material for the phase change layer 145 can include materials with low resistivity, such as germanium telluride (GeTe), germanium antimony telluride (GeSbTe), antimony telluride (SbTe), germanium selenium telluride (GeSeTe), In-doped PCM material, Sb-doped PCM, or any of a variety of similar materials.

In some embodiments, the phase change material may include a chalcogenide material, such as an indium(In)-antimony(Sb)-tellurium(Te) (IST) material or a germanium (Ge)-antimony(Sb)-tellurium(Te) (GST) material. The IST material may include $In_2Sb_2Te_5$, $In_1Sb_2Te_4$, $In_1Sb_4Te_7$, or the like. The GST material may include $GeSb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, and so on. Other storage element materials include transition metal oxide materials or alloys including two or more metals, such as transition metals, alkaline earth metals, and/or rare earth metals.

The phase change layer 145 may be formed by any suitable method, such as CVD, PVD, atomic layer deposition (ALD), or the like. The phase change layer 145 may have a thickness in a range of about 300 Å to about 2000 Å.

Figure 3G:
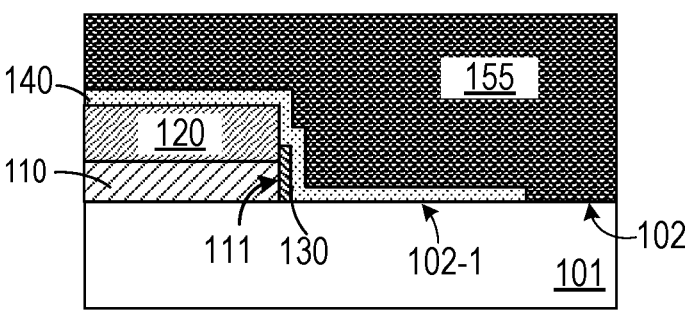
Figure 3H:
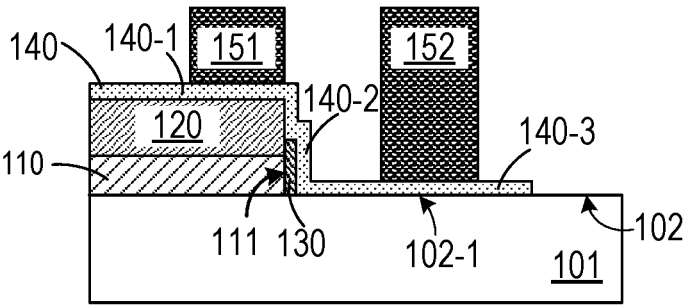

As shown in FIGS. 3G and 3H, method 200, at 280, includes depositing a conductive material 155 over the phase change element 140 and patterning the conductive material 155 to form a first conductive region 151 and a second conductive region 152 on opposite sides of the second dielectric region 130. The first conductive region 151 is disposed over the first portion 140-1 of the phase change element 140 over the first dielectric region 120. The second conductive region 152 is disposed over the third portion 140-3 of the phase change element 140 over the first portion 102-1 of the top surface 102 of the substrate 101. The first conductive region 151 and the second conductive region 152 are disposed on opposite sides of the second portion 140-2 of the phase change element 140, which is configured to receive heat from heater structure 110 through the second dielectric region 130 to cause changes to the resistivity of the second portion 140-2.

In some embodiments, the conductive material 155 can include a low electrical resistivity conductive material, such as W, WN, NiSi, Al, and so on. In some embodiments, conductive material 155 can include Ti, Co, Cu, AlCu, TiN, TiW, TiAl, TiAlN, or a combination thereof. The first conductive region 151 and second conductive region 152 may have the same material or different materials. For example, the first conductive region 151 and second conductive region 152 are both made of TiN. The conductive material 155 may be formed by any suitable method, such as CVD, physical vapor deposition (PVD), or the like. In some embodiments, the conductive material 155 can have a thickness in a range of about 300 Å to about 2000 Å.

Figure 3I:
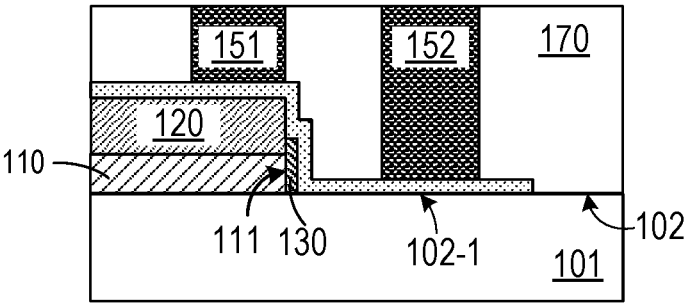

In FIG. 3I, a dielectric layer 170, for example, an interlayer dielectric, is deposited over the device structure of FIG. 3H, and planarized to form the phase change device illustrated in FIG. 1A. In some embodiments, dielectric layer 170 may include silicon oxide, silicon nitride, or other suitable dielectric materials. The planarization can be implemented using a CMP (chemical mechanical polishing)) or etching process.

Figure 4:
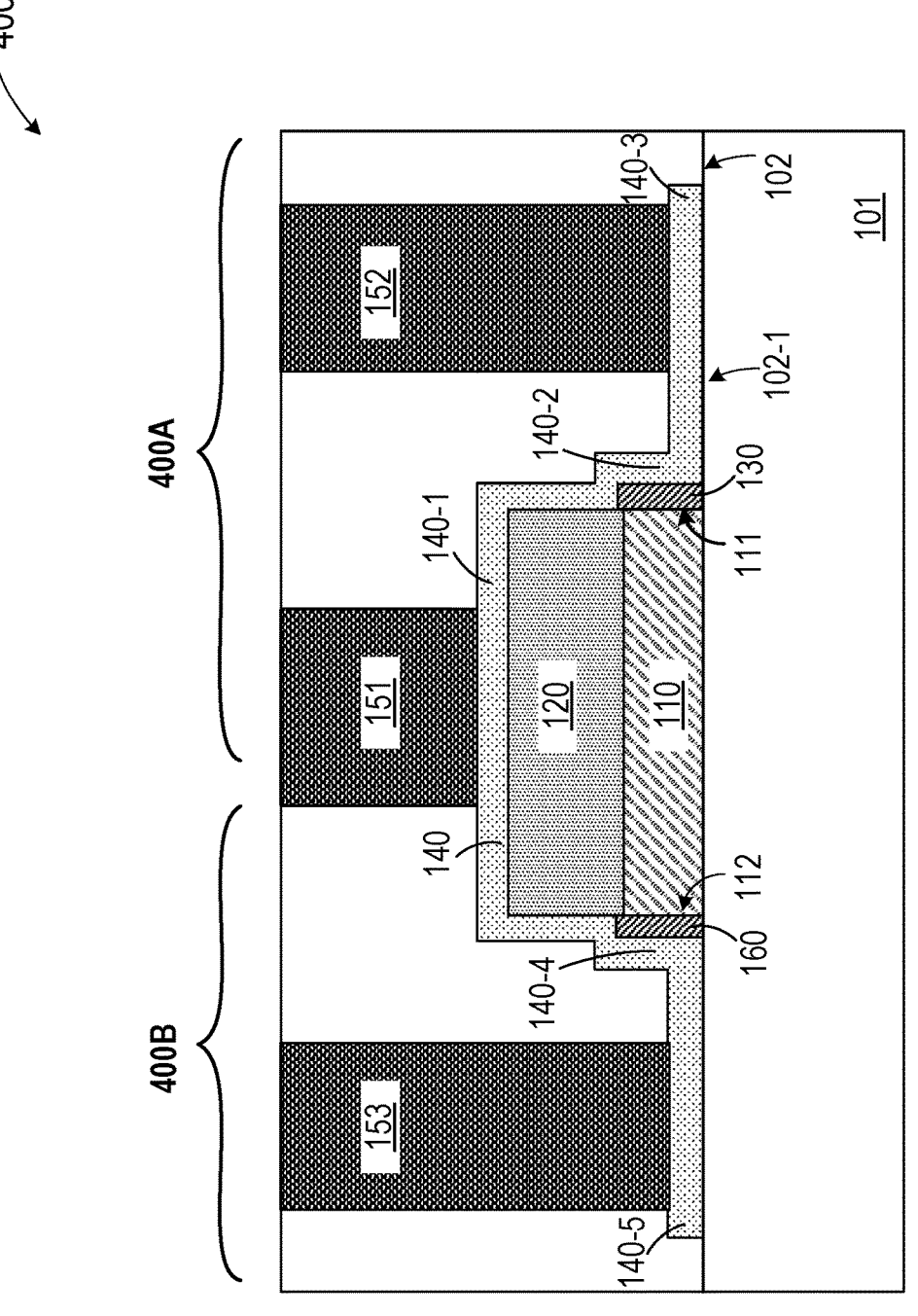
FIG. 4 is a cross-sectional view diagram illustrating another phase change device, in accordance with some embodiments.

FIG. 4 is a cross-sectional view diagram illustrating another phase change device, in accordance with some embodiments. A phase change device 400 shown in FIG. 4 includes two portions. A first portion 400A is similar to phase change device 100 in FIG. 1A, and a second portion 400B that has a similar device extending to the other side of the heater structure. Phase change device 400 operates as two phase change devices in a parallel connection. In some embodiments, the two phase change devices have the same components, and the composite phase change device 400 is characterized by a resistance that is half of the resistance of phase change device 100 in FIG. 1A.

As shown in FIG. 4, phase change device 400 includes a substrate 101 having a top surface 102, and a heater structure 110 disposed on the substrate 101. The heater structure 110 has a first sidewall 111 and second sidewall 112 on opposite sides of the heater structure 110. Phase change device 400 also includes a first dielectric region 120 disposed over the heater structure 110. The first dielectric region 120 includes a thermally insulating and electrically insulating material. Phase change device 400 also includes a second dielectric region 130 disposed over the first sidewall 111 of the heater structure 110. The second dielectric region 130 includes a thermally conductive and electrically insulating material. A phase change element 140 is disposed over the heater structure 110, the first dielectric region 120, the second dielectric region 130, and a first portion 102-1 of the top surface 102 of the substrate 101 extending away from the second dielectric region 130 and the heater structure 110. Phase change device 400 also includes a first conductive region 151 and a second conductive region 152 disposed over the phase change element 140 on either side of the second dielectric region 130.

In some embodiments, the phase change element 140 includes three connected portions. A first portion 140-1 is disposed over the heater structure 110 and separated from the heater structure 110 by the first dielectric region 120. A second portion 140-2 is disposed over a sidewall 111 of the heater structure 110. A third portion 140-2 is disposed over the first portion 102-1 of the top surface 102 adjacent to and spaced apart from the first sidewall 111 of the heater structure 110. The second portion 140-2 is configured to receive heat from heater structure 110 through the second dielectric region 130, which changes the resistivity of the second portion 140-2. The first portion 140-1 and the third portion 140-3 are configured to be contacted by conductive regions that are electrodes of the phase change switch device.

As shown in FIG. 4, in the second portion 400B, phase change device 400 also includes a third dielectric region 160 disposed on the second sidewall 112 of the heater structure 110. The third dielectric region 160 is thermally conductive and electrically insulating. In some embodiments, the third dielectric region 160 is made of similar materials as the second dielectric region 130. In some embodiments, the third dielectric region 160 and the second dielectric region 130 can be formed in the same processing process.

The phase change element 140 is also disposed over the third dielectric region 160 and a second portion 102-2 of the top surface 102 of the substrate 101 extending away from the third dielectric region 160 and the heater structure 110. The third dielectric region 160 separates the phase change element 140 from the second sidewall 112 of the heater structure 110. In this arrangement, the phase change element 140 includes a fourth portion 140-4 disposed over the second sidewall 112 of the heater structure 110, and a fifth portion 140-5 disposed over a second portion 102-2 of the substrate 101 adjacent to and spaced apart from second sidewall 112 of the heater structure 110.

In some embodiments, phase change device 400 also includes a third conductive region 153 disposed over the phase change element 140 over a second portion 102-2 of the top surface 102 of the substrate 101.

FIGS. 5A-5I are cross-sectional view diagrams illustrating a method for forming a phase change device, in accordance with some embodiments. FIGS. 5A-5I illustrate processes for forming phase change device 400 of FIG. 4. In some embodiments, phase change device 400 can be formed using the processes and materials of method 200 illustrated in the flowchart of FIG. 2. However, modifications are made in the masks in order to form device components in portion 400B of FIG. 4. The method for forming phase change device 400 is summarized below, and the details of processes and materials described above in connection to FIGS. 3A-3I are not repeated here.

Figure 5A:
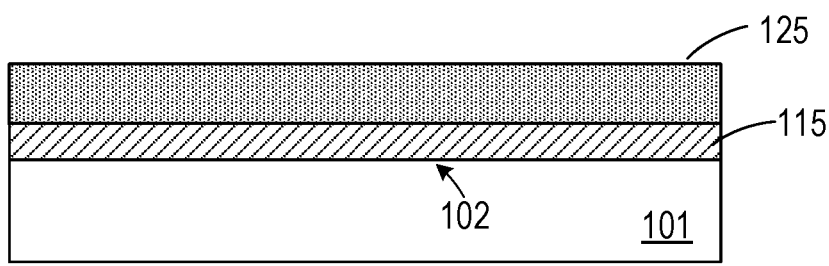
FIGS. 5A-5I are cross-sectional view diagrams illustrating a method for forming a phase change device, in accordance with some embodiments.

In FIG. 5A, a substrate 101 comprising a top surface 102 is provided, and a layer of heater material 115 is formed over the substrate 101. Next, a first dielectric layer 125 is formed over the layer of heater material 115.

Figure 5B:
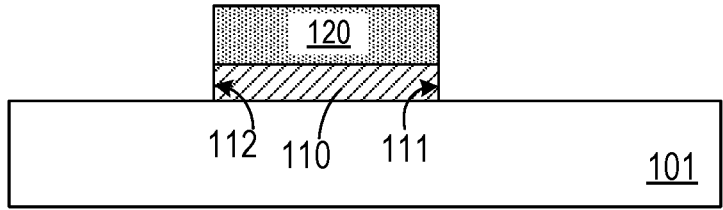

In FIG. 5B, the first dielectric layer 125 and the layer of heater material 115 are patterned to form a first dielectric region 120 over a heater structure 110 having a first sidewall 111 and a second sidewall 112.

Figure 5C:
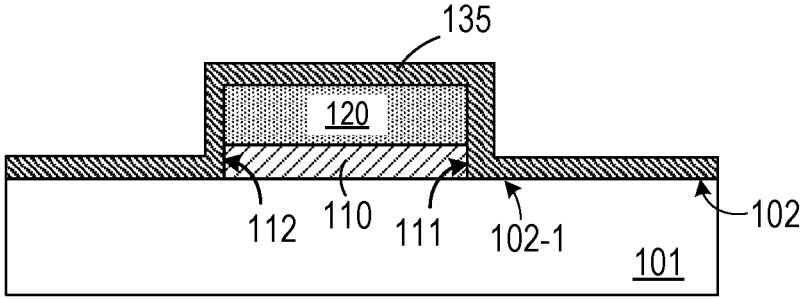

In FIG. 5C, a second dielectric layer 135 is deposited over the first dielectric region 120 and the heater structure 110. The second dielectric layer 135 also is disposed over a first portion 102-1 of the top surface 102 of the substrate 101 extending away from the heater structure. The second dielectric region includes a thermally conductive and electrically insulating material.

Figure 5D:
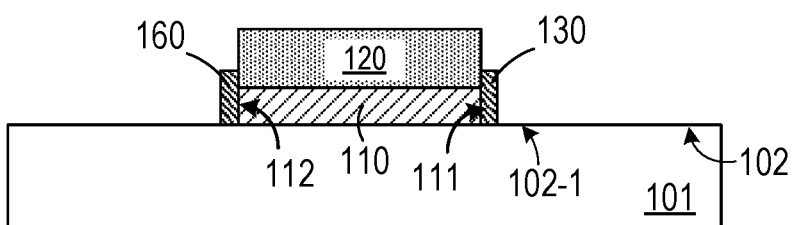

In FIG. 5D, portions of the second dielectric layer 135 are removed to form a second dielectric region 130 over the first sidewall 111 of the heater structure 110 and to form a third dielectric region 160 over the second sidewall 112 of the heater structure 110. The process is similar to the spacer formation process in MOS transistor fabrication. An anisotropic etching process is used to remove the portions of the second dielectric layer 135 to form the spacers.

Figure 5E:
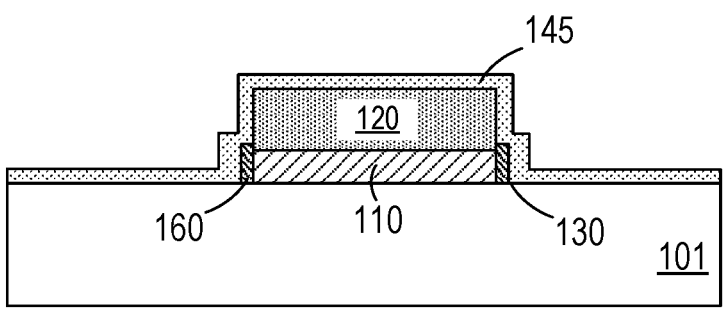

In FIG. 5E, a layer of phase change material 145 is deposited.

Figure 5F:
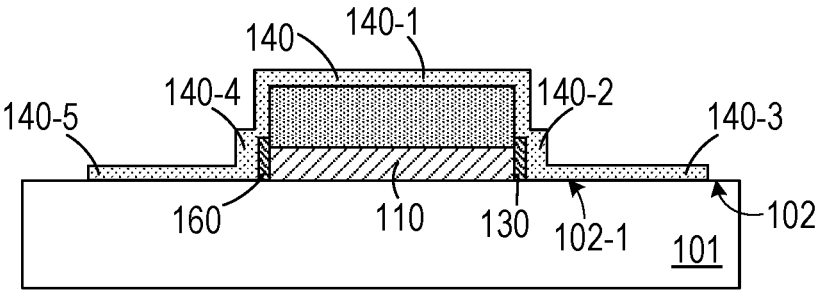

Next, in FIG. 5F, the layer of phase change material 145 is patterned to form a phase change element 140, which includes five connected portions. A first portion 140-1 is disposed over the heater structure 110 and separated from the heater structure 110 by the first dielectric region 120. A second portion 140-2 is disposed over a sidewall 111 of the heater structure 110. A third portion 140-3 is disposed over the first portion 102-1 of the top surface 102 adjacent to and spaced apart from the first sidewall 111 of the heater structure 110. The phase change element 140 also includes a fourth portion 140-4 disposed over the second sidewall 112 of the heater structure 110, and a fifth portion 140-5 disposed over a second portion 102-2 of the substrate 101 adjacent to and spaced apart from second sidewall 112 of the heater structure 110.

Figure 5G:
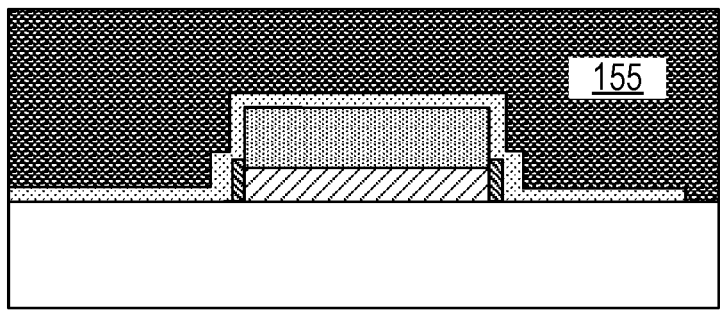

In FIG. 5G, a conductive material 155 is deposited over the phase change element 140.

Figure 5H:
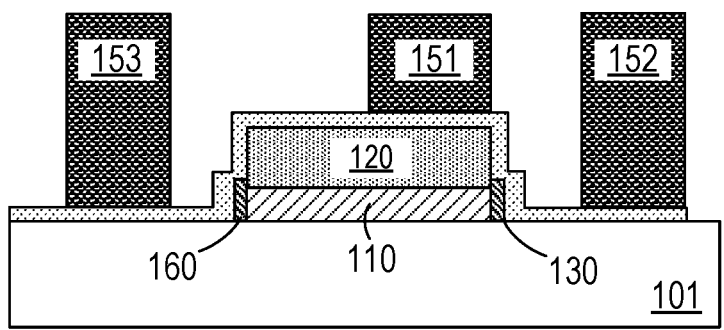

In FIG. 5H, conductive material 155 is patterned to form a first conductive region 151, a second conductive region 152, and a third conductive region 153. A first conductive region 151 and the second conductive region 152 are formed on opposite sides of the second dielectric region 130. The first conductive region 151 and the first conductive region 153 are formed on opposite sides of the second dielectric region 160.

Figure 5I:
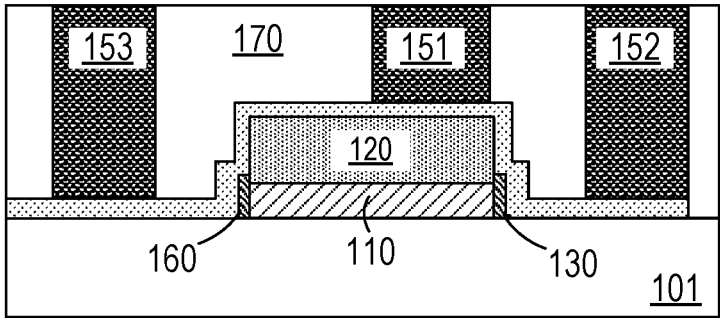

In FIG. 5I, a dielectric layer 170, for example, an interlayer dielectric, is deposited over the device structure of FIG. 5H, and planarized to form the phase change device illustrated in FIG. 4. Phase change device 400 operates as two phase change devices in a parallel connection. In some embodiments, the two phase change devices have the same components, and the composite phase change device 400 is characterized by a resistance that is half of the resistance of phase change device 100 in FIG. 1A.

FIG. 6 is a cross-sectional view diagram illustrating yet another phase change device, in accordance with some embodiments. A phase change device 600 shown in FIG. 6 is similar to phase change device 400 in FIG. 4, with the exception that phase change device 600 does not have a third conductive region 153 and the fifth portion 140-5 of phase change element 140 is shorter in phase change device 600. The device structure and fabrication method for phase change device 600 are otherwise similar to those of phase change device 400. Therefore, the details are not repeated here. Phase change device 600 shown in FIG. 6 is similar to phase change device 100 in FIG. 1A, with the addition of the third dielectric region 160 and the fourth portion 140-4 and fifth portion 140-5 of phase change element 140. The operations of phase change device 600 are similar to those of phase change device 100 in FIG. 1A.

In various embodiments, phase change switch device structures and methods are described above. These device structures and methods provide many advantages. For example, the on resistance (Ron) and cut off capacitance (Coff) are separately controllable and are determined by the thickness of different films. Further, the write voltage is controlled by the heater width, which does not depend on other device parameters, enabling low write voltage applications. Further, device FOM (figures of merit) and write voltage are designed by different structure factors. High FOM is obtained by thin film thickness, while low write voltage is achieved by enlarging heater width. Therefore, device FOM (figures of merit) and write voltage can be optimized independently. In contrast, in conventional phase change switch devices often requires tradeoffs between device parameters and performance.

In some embodiments, a phase change device is provided. The phase change device includes a substrate with a top surface. A heater structure is disposed on the substrate. The heater structure has first and second sidewalls on opposite sides of the heater structure. A first dielectric region is disposed over the heater structure. The first dielectric region includes a thermally insulating and electrically insulating material. A second dielectric region is disposed over the first sidewall of the heater structure, and the second dielectric region includes a thermally conductive and electrically insulating material. A phase change element is disposed over the first dielectric region, the heater structure, the second dielectric region, and a first portion of the top surface of the substrate extending away from the second dielectric region and the heater structure. The phase change device also includes first and second conductive regions disposed over the phase change element and on opposite sides of the second dielectric region.

In some embodiments, a phase change device includes a substrate with a top surface. A heater structure is disposed on the substrate, and the heater structure has first and second sidewalls on opposite sides of the heater structure. The phase change device includes a phase change element disposed over the heater structure. The phase change element includes three connected portions. A first portion is disposed over the heater structure. A second portion is disposed over the first sidewall of the heater structure. A third portion is over a first portion of the top surface of the substrate adjacent to and spaced apart from the first sidewall of the heater structure.

In some embodiments, a method for making a phase change device includes providing a substrate with a top surface and forming a layer of heater material over the substrate. The method also includes depositing a first dielectric layer over the layer of heater material. The first dielectric layer includes a thermally insulating and electrically insulating material. The method further includes patterning the first dielectric layer and the layer of heater material to form a first dielectric region over a heater structure. Next, a second dielectric layer is deposited over the first dielectric region and the heater structure, and the second dielectric layer includes a thermally conductive and electrically insulating material. The method includes removing portions of the second dielectric layer to form a second dielectric region over a first sidewall of the heater structure. The method further includes depositing and patterning a layer of phase change material to form a phase change element over the first dielectric region, the second dielectric region, and a first portion of the top surface of the substrate and extending away from the second dielectric region and the heater structure. Further, a conductive material is deposited over the phase change element and patterned to form a first conductive region over the first dielectric region and a second conductive region over the first portion of the top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change device, comprising:
a substrate comprising a top surface;
a heater structure disposed on the substrate, the heater structure having first and second sidewalls on opposite sides of the heater structure;

a first dielectric region disposed over the heater structure, the first dielectric region comprising a thermally insulating and electrically insulating material;
a second dielectric region disposed over the first sidewall of the heater structure, the second dielectric region comprising a thermally conductive and electrically insulating material;
a phase change element disposed over the first dielectric region, the heater structure, the second dielectric region, and a first portion of the top surface of the substrate extending away from the second dielectric region and the heater structure; and
first and second conductive regions disposed over the phase change element and on opposite sides of the second dielectric region.

2. The phase change device of claim 1, wherein:
the first dielectric region comprises a silicon oxide material; and
the second dielectric region comprises a silicon nitride material.

3. The phase change device of claim 1, wherein the phase change element comprises a phase change material, and the phase change material comprises a germanium (Ge)-antimony (Sb)-tellurium (Te) (GST) material or an indium (In)-antimony (Sb)-tellurium (Te) (IST) material.

4. The phase change device of claim 1, wherein the second dielectric region is configured as a sidewall spacer to the heater structure and disposed perpendicularly to the top surface of the substrate.

5. The phase change device of claim 4, wherein the phase change element comprises a portion that extends perpendicularly to the top surface of the substrate and is disposed adjacent to the second dielectric region to receive heat from the heating structure.

6. The phase change device of claim 1, wherein the heater structure is thermally insulated at a top surface and a bottom surface by thermally insulating dielectrics and is configured to transfer heat from the first sidewall through the second dielectric region.

7. The phase change device of claim 1, further comprising a third dielectric region disposed on the second sidewall of the heater structure, which is thermally conductive and electrically insulating;
wherein the phase change element is disposed over the third dielectric region and a second portion of the top surface of the substrate extending away from the third dielectric region and the heater structure.

8. The phase change device of claim 7, further comprising a third conductive region disposed over the phase change element over the second portion of the top surface of the substrate.

9. A phase change device, comprising:
a substrate comprising a top surface;
a heater structure disposed on the substrate, the heater structure having a first and second sidewalls on opposite sides of the heater structure;
a phase change element disposed over the heater structure, the phase change element including three connected portions, wherein:
a first portion is disposed over the heater structure;
a second portion is disposed over the first sidewall of the heater structure; and
a third portion is disposed over a first portion of the top surface of the substrate adjacent to and spaced apart from the first sidewall of the heater structure;
a first dielectric region separating the phase change element from a top surface of the heater structure; and a second dielectric region separating the phase change element from the first sidewall of the heater structure.

10. The phase change device of claim 9, wherein:

the first dielectric region comprises a thermally insulating and electrically insulating material; and the second dielectric region comprises a thermally conductive and electrically insulating material.

11. The phase change device of claim 10, wherein:

the first dielectric region comprises a silicon oxide material; and the second dielectric region comprises a silicon nitride material.

12. The phase change device of claim 9, wherein the phase change element further comprises:

a fourth portion disposed over the second sidewall of the heater structure; and a fifth portion disposed over a second portion of the substrate adjacent to and spaced apart from second sidewall of the heater structure.

13. The phase change device of claim 12, further comprising a third dielectric region separating the phase change element from the second sidewall of the heater structure.

14. A phase change device, comprising:

a substrate;

a heater structure disposed on the substrate, the heater structure having a first sidewall and a second sidewall located at opposite sides of the heater structure;

a first dielectric region disposed on the heater structure, the first dielectric region comprising a thermally insulating and electrically insulating material;

a second dielectric region disposed on the first sidewall of the heater structure, the second dielectric region comprising a thermally conductive and electrically insulating material; and a phase change element disposed over the first dielectric region, the heater structure, the second dielectric region, and a first portion of a top surface of the substrate extending away from the second dielectric region and the heater structure.

15. The phase change device of claim 14, wherein:

the first dielectric region comprises a silicon oxide material; and the second dielectric region comprises a silicon nitride material.

16. The phase change device of claim 14, wherein the phase change element comprises a phase change material, and the phase change material comprises a germanium (Ge)-antimony (Sb)-tellurium (Te) (GST) material or an indium (In)-antimony (Sb)-tellurium (Te) (IST) material.

17. The phase change device of claim 14, wherein the second dielectric region is configured as a sidewall spacer to the heater structure and disposed perpendicularly to the top surface of the substrate.

18. The phase change device of claim 17, wherein the phase change element comprises a portion that extends perpendicularly to the top surface of the substrate and is disposed adjacent to the second dielectric region to receive heat from the heating structure.

19. The phase change device of claim 14, wherein the heater structure is thermally insulated at a top surface and a bottom surface by thermally insulating dielectrics and is configured to transfer heat from the first sidewall through the second dielectric region.

\* \* \* \* \*